(12) United States Patent
Maeda et al.

(10) Patent No.: US 6,589,386 B1
(45) Date of Patent: Jul. 8, 2003

(54) DEVICE FOR PROCESSING WAFER

(75) Inventors: Norio Maeda, Yamatokouriyama (JP); Masao Oono, Sakai (JP); Hiroshi Aihara, Sakai (JP)

(73) Assignees: Toho Kasei Ltd., Nara (JP); Daikin Industries, Ltd., Osaka (JP)

( * ) Notice: Subject to any disclaimer, the term of this patent is extended or adjusted under 35 U.S.C. 154(b) by 0 days.

(21) Appl. No.: 09/601,993
(22) PCT Filed: Dec. 13, 1999
(86) PCT No.: PCT/JP99/06998
§ 371 (c)(1),
(2), (4) Date: Aug. 11, 2000
(87) PCT Pub. No.: WO00/36644
PCT Pub. Date: Jun. 22, 2000

(30) Foreign Application Priority Data

Dec. 11, 1998 (JP) .......................................... 10-352593

(51) Int. Cl.⁷ ........................ H01L 21/68; H01L 21/304
(52) U.S. Cl. .................................... 156/345.23; 134/34
(58) Field of Search ............................ 156/345, 345.23; 134/34

(56) References Cited

U.S. PATENT DOCUMENTS

| | | | | |
|---|---|---|---|---|
| 4,967,777 A | * | 11/1990 | Takayama et al. | 134/102.2 |
| 5,071,488 A | * | 12/1991 | Takayama et al. | 134/34 |
| 5,236,515 A | * | 8/1993 | Ueno et al. | 134/25.4 |

FOREIGN PATENT DOCUMENTS

| | | |
|---|---|---|
| JP | 2-46727 | 2/1990 |
| JP | 4-349626 | 12/1992 |
| JP | 5-36668 | 2/1993 |
| JP | 8-141526 | 6/1996 |
| JP | 10-22256 | 1/1998 |
| JP | 11-211345 | 8/1999 |
| JP | 11-307504 | 11/1999 |
| JP | 11-345798 | 12/1999 |

OTHER PUBLICATIONS

Microfilm of the specification and drawings annexed to the request of Japanese Utility Model Application No. 105309/1989 (Laid–open No. 45636/1991), (Fujitsu Limited), Apr. 26, 1991.

* cited by examiner

Primary Examiner—Benjamin L. Utech
Assistant Examiner—Sylvia R. MacArthur
(74) Attorney, Agent, or Firm—Stephen B. Parker, Esq.; Rothwell, Figg, Ernst & Manbeck, p.c.

(57) ABSTRACT

A device for processing a substrate comprises a processing vessel (1), an outer vessel (2) for surrounding the processing vessel (1) which outer vessel (2) can be sealed, a first supporting member (4) for bringing the substrate (3) into and out from the processing vessel (1) which first supporting member (4) supports the substrate (3) in a standing manner, and a second supporting member (5) for transferring the substrate (3) between the first supporting member (4) which second supporting member (5) is movable up and down within the processing vessel (1). The device processes the entire surface of the substrate (3) uniformly and prevents varying in processing from occurrence.

9 Claims, 4 Drawing Sheets

DEVICE FOR PROCESSING WAFER

TECHNICAL FIELD

The present invention relates to a device for processing a substrate. More particularly, the present invention relates to a device for processing a substrate which is brought into a processing vessel using a substrate bringing member.

BACKGROUND ART

From the past, a device having an arrangement is proposed as a device for processing a substrate which arrangement is illustrated in Japanese Patent Laid-Open Gazette No. 8-141526.

This drevice for processing a substrate has a first supposing member and a second supporting member. The first supporting member for supporting a substrate is provided in a fixed manner in an interior of a processing vessel. The second supporting member is movable. The second supporting member supports a substrate and brings the substrate in and out of the processing vessel.

When the device for processing a substrate having the above arrangement is employed, a substrate is brought in the processing vessel to a position using the second supporting member first, the substrate at the position being not in engage with the first supporting member. Under this condition, the substrate is processed by supplying processing fluid within the processing vessel. Then, the second supporting member is further moved so that the substrate is supported by the first supporting member. Under this condition, the substrate is processed by supplying processing fluid within the processing vessel.

When such processing is carried out for the substrate, the engagement sections of the substrate and the first supporting member and the engagement sections of the substrate and the second supporting member are processed well so that the entire surface of the substrate is processed uniformly.

When the device for processing a substrate having the arrangement is employed which arrangement is illustrated in Japanese Patent Laid-Open Gazette No. 8-141526, the intruding distance of the second supporting member within the processing vessel should be increased so that the substrate is automatically transferred to the first supporting member. Therefore, the substrate relatively moves with respect to the processing vessel when the substrate is transferred from the second supporting member to the first supporting member, so that the relative speed of the substrate and the processing fluid is changed. When the relative speed of the substrate and the processing fluid is changed, the processing degree by the processing fluid varies so that a disadvantage arises in that the processing quality of the substrate is lowered. This disadvantage remarkably appears when the substrate is dried while cleaning fluid is being discharged after the cleaning of the substrate has finished.

Further, when the substrate is transferred from the first supporting member to the second supporting member after the cleaning fluid has discharged, the cleaning fluid remains at portions of the substrate and the first supporting member at which portions the substrate and the first supporting member was contacted to one another. And, a great amount of nitrogen gas is necessary and a long time period is necessary for evaporating the remained cleaning fluid.

The present invention was made in view of the above problems.

It is an object of the present invention to offer a device for processing a substrate which device processes an entire surface of a substrate uniformly and prevents relative position of the substrate and a processing vessel during midway of the processing from varying.

DISCLOSURE OF THE INVENTION

A device for processing a substrate of claim 1 is a device which houses a substrate within a processing vessel and processes the substrate by supplying processing fluid within the processing vessel, the device comprises a first supporting member for supporting a substrate stably under a natural condition and for carrying out bringing of the substrate into and out from the processing vessel, and a movable second supporting member for receiving the substrate which is supported by the first supporting member and for supporting the substrate stably.

A device for processing a substrate of claim 2 further comprises control means for operating the first supporting member and the second supporting member when the substrate is transferred, so that relative movement of the substrate with respect to the processing vessel is prevented from occurrence.

A device for processing a substrate of claim 3 employs a supporting member which is united with a stream arrangement plate member as the second supporting member, the stream arrangement plate member supplying processing fluid having predetermined velocity distribution within the processing vessel from the lower position thereof.

When the device for processing a substrate of claim 1 is employed, and when a substrate is housed within the processing vessel and is processed by supplying the processing fluid within the processing vessel, the device comprises the first supporting member for supporting the substrate stably under a natural condition and for carrying out bringing of the substrate into and out from the processing vessel, and the movable second supporting member for receiving the substrate which is supported by the first supporting member and for supporting the substrate stably. Therefore, the substrate is stably supported under a natural condition by the first supporting member which brings the substrate into and out from the processing vessel, and the substrate is brought into the processing vessel by intruding the first supporting member into the processing vessel. Under this condition, the substrate is processed by supplying the processing fluid within the processing vessel. But, in this case, engagement sections of the substrate and the first supporting member are not processed. Next, the second supporting member is moved within the processing vessel so as to engage the second supporting member with the substrate, and the first supporting member is further intruded, so that the substrate is transferred from the first supporting member to the second supporting member. And, during the transferring operation of the substrate, the relative position of the substrate with respect to the processing vessel is maintained to be a constant position. When the substrate is processed by supplying the processing fluid within the processing vessel under the condition that the substrate is supported by the second supporting member, the engagement sections of the substrate and the first supporting member are processed. As a result, the entire surface of the substrate is uniformly processed. As is apparent from the foregoing description, the relative position of the substrate with respect to the processing vessel is maintained to be a constant position and the relative speed of the substrate with respect to the processing fluid is maintained to be a constant speed during the entire processing time period, therefore varying in processing is not generated so that the processing with high quality is realized.

When the device for processing a substrate of claim 2 is employed, though the device further comprises the control means for operating the first supporting member and the second supporting member when the substrate is transferred, so that relative movement of the substrate with respect to the processing vessel is prevented from occurrence, operations and effects which are similar to those of claim 1 are realized by operating both supporting members by the control means.

When the device for processing a substrate of claim 3 is employed, though the device employs a supporting member which is united with a stream arrangement plate member as the second supporting member, the stream arrangement plate member supplying processing fluid having predetermined velocity distribution within the processing vessel from the lower position thereof, the moving mechanism of the second supporting member and the attaching and detaching mechanism of the stream arrangement plate member are united in addition to the operations and effects of claim 1 or claim 2.

BEST MODE FOR CARRYING OUT THE INVENTION

Hereinafter, referring to the attached drawings, we explain a device for processing a substrate of embodiments according to the present invention in detail.

Figure 1:
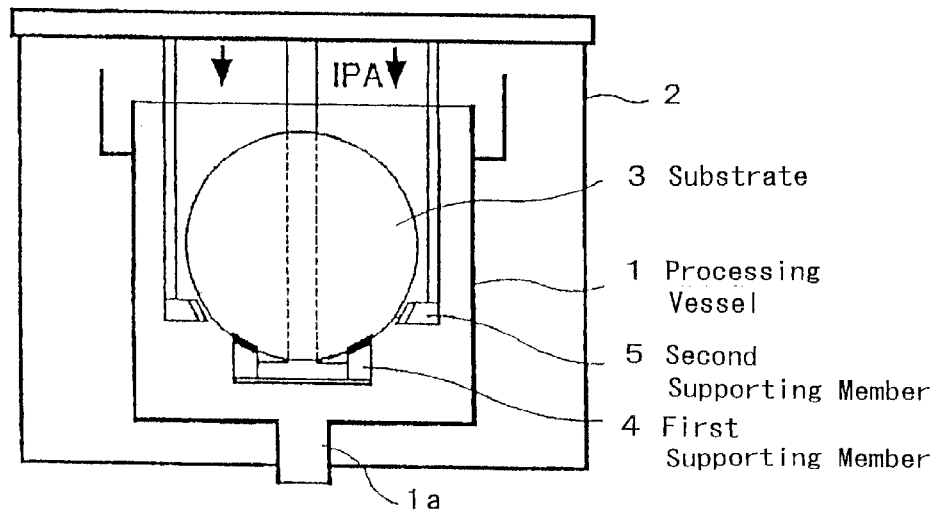
FIG. 1 is a schematic vertical cross sectional view of a device for processing a substrate of an embodiment according to the present invention.

FIG. 1 is a schematic vertical cross sectional view of a device for processing a substrate of an embodiment according to the present invention.

This device for processing a substrate includes a processing vessel 1, an outer vessel 2 for surrounding the processing vessel 1, the outer vessel 2 being able to be sealed, a first supporting member 4 for supporting a substrate (for example, a semiconductor wafer) 3 in a standing manner and for bringing the substrate into and out from the processing vessel 1, and a second supporting member 5 for transferring the substrate 3 between the first supporting member 4, the second supporting member 5 being movable up and down within the processing vessel 1. The reference numeral of 1a represents a cleaning liquid discharging pipe for discharging the cleaning liquid (for example, pure water) from the processing vessel 1.

Operations and effects of the device for processing a substrate having the above arrangement is as follows.

When cleaning of a substrate 3 has finished, the processing vessel 1 is filled with cleaning liquid, the substrate 3 is supported by the first supporting member 4 in a natural condition, and the substrate 3 is steeped in the cleaning liquid, as is illustrated in FIG. 1. In this condition, the substrate 3 is apart from the second supporting member 5. Then, drying fluid (for example, isopropyl alcohol vapor, mist or the like) is supplied into the outer vessel 2 through a cover body of the sealed outer vessel 2 and the cleaning liquid is discharged from the processing vessel 1 through the cleaning liquid discharging pipe 1a for drying the cleaned substrate 3.

When this operation is carried out, rapid drying is realized by replacing the cleaning liquid with drying fluid membrane at a portion of the substrate 3 exposed from the cleaning fluid.

Figure 2:
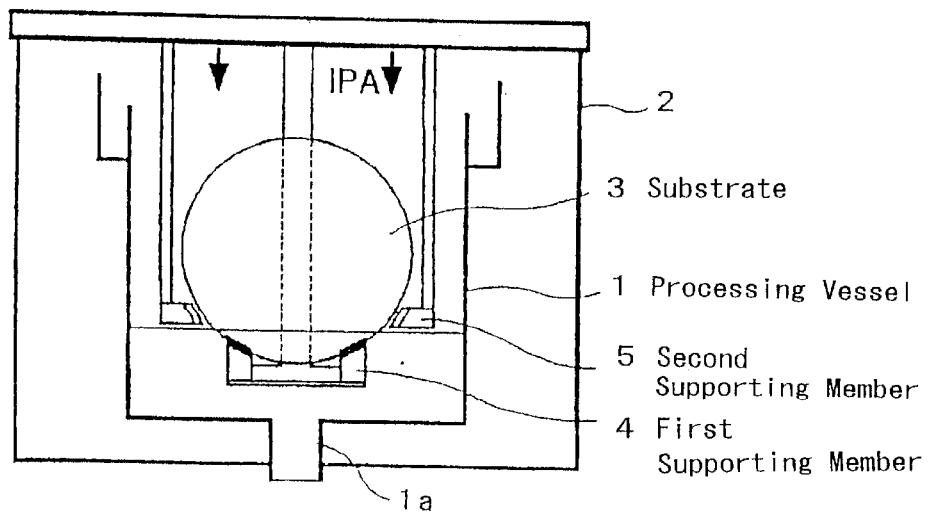
FIG. 2 is a schematic vertical cross sectional view of processing fluid decreasing condition of the device for processing a substrate.

When discharging of the cleaning liquid is continued, the surface of the cleaning liquid is gradually lowered. When the surface of the cleaning liquid is positioned between the second supporting member 5 and the first supporting member 4, as is illustrated in FIG. 2, the second supporting member 5 is dried and portions of the substrate 3 is also dried, the portions being to be supported by the second supporting member 5.

Figure 3:
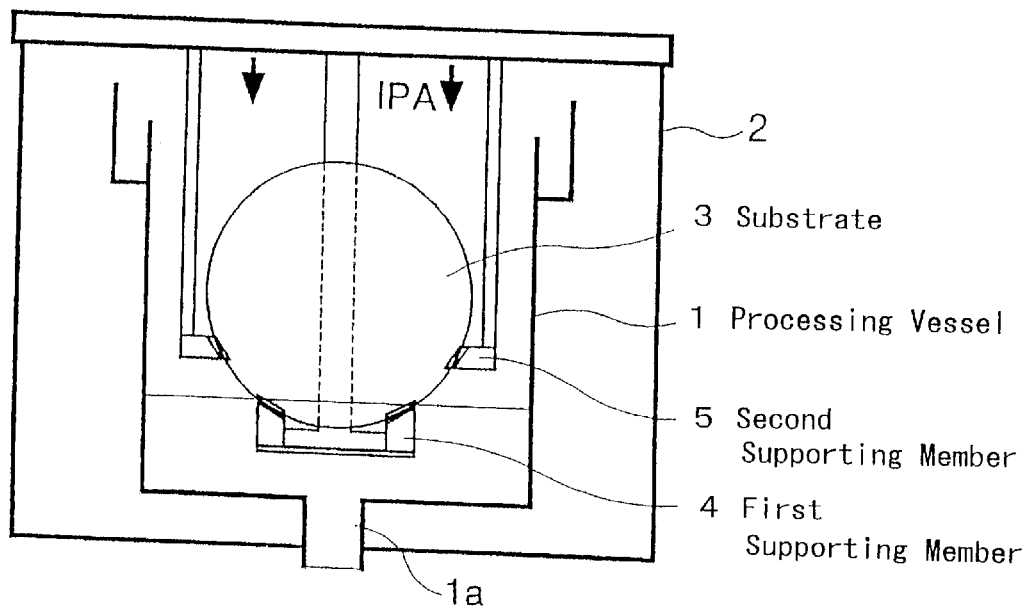
FIG. 3 is a schematic vertical cross sectional view of substrate transferring operation condition of the device for processing a substrate.
Figure 4:
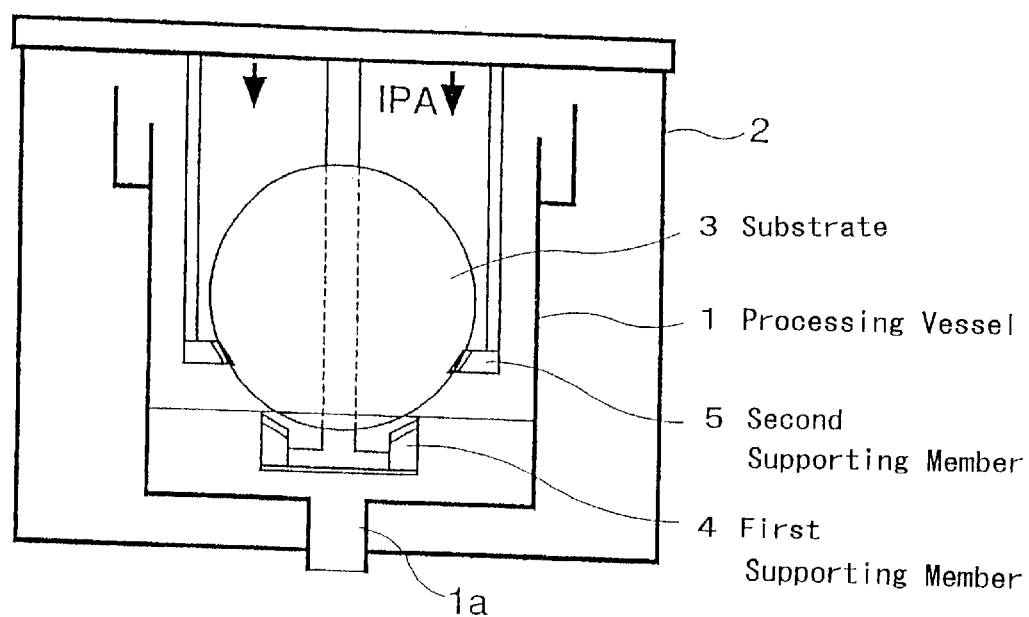
FIG. 4 is a schematic vertical cross sectional view of substrate transferred condition of the device for processing a substrate.

The second supporting member 5 is moved upward so as to engage with the substrate 3 (refer to FIG. 3), then the first supporting member 4 is moved downward so that the substrate 3 is transferred from the first supporting member 4 to the second supporting member 5 (refer to FIG. 4). When such transferring operation of the substrate 3 is carried out, the relative position of the substrate 3 with respect to the processing vessel 1 is maintained to be a constant position. Therefore, the relative speed of the substrate 3 with respect to the surface of the cleaning liquid is maintained to be a constant speed so that uniform drying is realized.

Supplying of the drying fluid and discharging of the cleaning liquid are continued thereafter so that the entire surface of the remaining portion of the substrate 3 and the first supporting member 4 are dried.

After discharging of the cleaning liquid has finished, the drying fluid is discharged from the processing vessel 1 and the outer vessel 2 by supplying nitrogen gas through the cover body of the outer vessel 2 because cleaning liquid is not remained at portions at where the second supporting member 5 and the substrate 3 so that the drying processing of the substrate 3 is finished. Therefore, the consumption quantity of the nitrogen gas is reduced. Further, an entirely required time period is shortened.

When the drying processing has finished by the above operations, the dried substrate 3 is brought out from the processing vessel 1 by opening the cover body of the outer vessel 2 and by moving the first supporting member 4 upward.

The drying processing of the substrate 3 is described in the foregoing. When the substrate 3 is cleaned, the entire surface of the substrate 3 is uniformly cleaned without varying by sequentially selecting a condition in which the substrate 3 is supported by the first supporting member 4 and a condition in which the substrate 3 is supported by the second supporting member 5, by varying the positions of the first supporting member 4 and the second supporting member 5 within the processing vessel 1.

Figure 5:
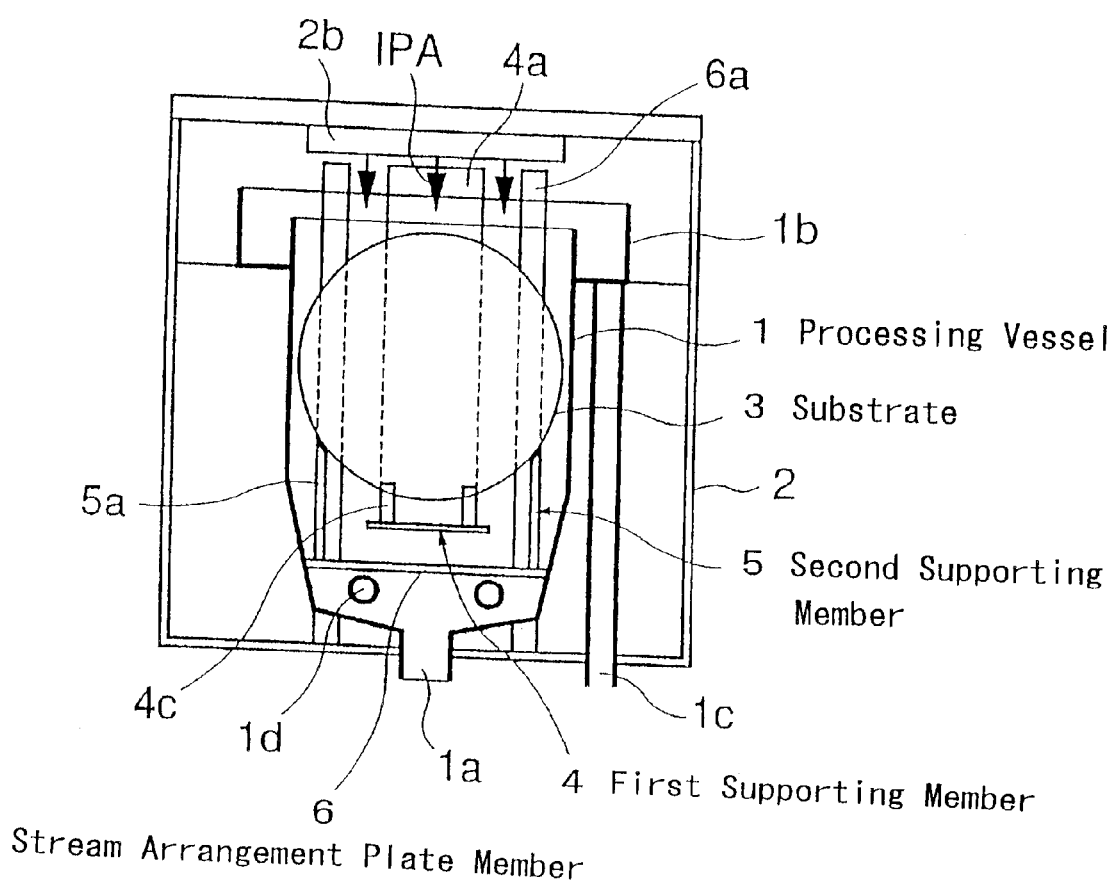
FIG. 5 is a vertical cross sectional front view of a device for processing a substrate of another embodiment according to the present invention.
Figure 6:
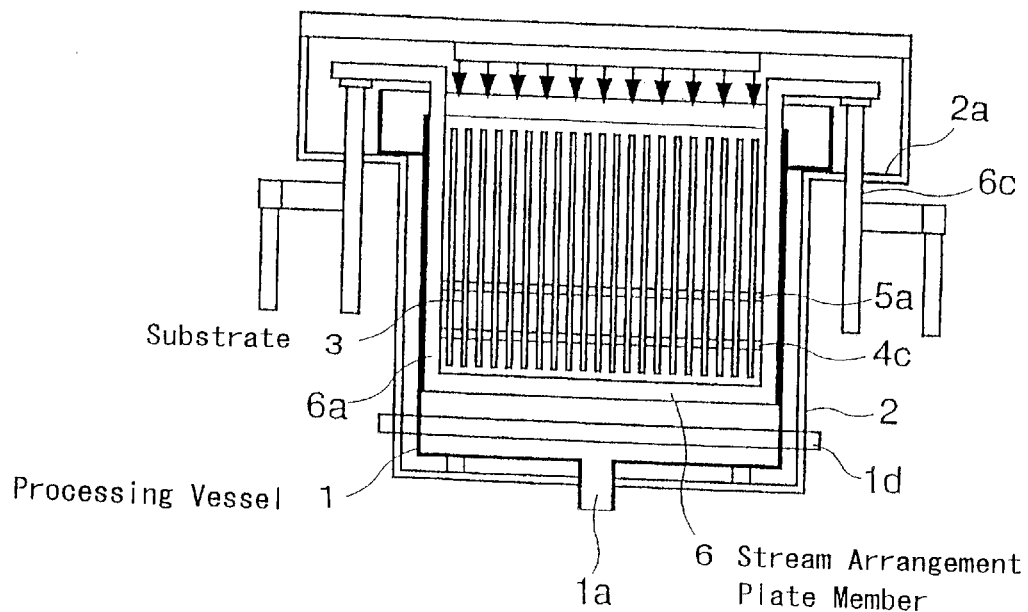
FIG. 6 is a vertical cross sectional side view of the same.
Figure 7:
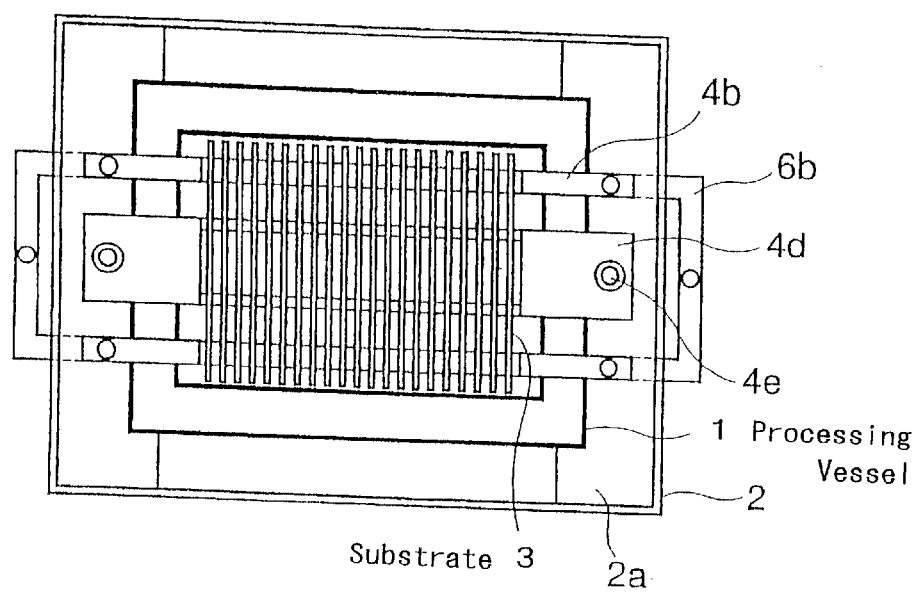
FIG. 7 is a plan view of the same.

FIG. 5 is a vertical cross sectional front view of a device for processing a substrate of another embodiment according to the present invention, while FIG. 6 is a vertical cross sectional side view of the same, while FIG. 7 is a plan view of the same.

The device for processing a substrate is most different from the above device for processing a substrate in that a stream arrangement plate member 6 and the second supporting member 5 are united with one another which stream arrangement member supplying cleaning liquid having a predetermined velocity distribution from bottom section of the processing vessel 1 towards a substrate housing section.

The processing vessel 1 has an overflow vessel 1b which surrounds an upper outer peripheral section of the processing vessel 1 and has a cleaning fluid discharging pipe 1c which discharges cleaning fluid from the overflow vessel 1b. The processing vessel 1 has a constant width in its upper section with respect to the central section and has a descending width in its lower section with respect to the central section. A cleaning fluid supplying pipe 1d is provided at a predetermined position of a space of the processing vessel 1, the space being lower with respect to the stream arrangement plate member 6. The outer vessel 2 is enlarged its upper section in front and rear directions so as to form step sections 2a. The overflow vessel 1b is engaged with the step sections 2a so that the processing vessel 1 is supported in a hanging condition. A drying fluid supplying member 2b for supplying drying fluid is provided at the central section of the lower face of the cover body of the outer vessel 2. The first supporting member 4 includes a pair of plate members 4a elongating in up and down directions, rod shape bodies 4b which connect both edge sections of the lower edge sections of the plate members 4a, engagement members 4c provided on the upper face of each rod shape body 4b each engagement member 4c engages a peripheral section of the substrate 3, horizontal members 4d each extends outward from the upper edge section of each plate member 4a, and stays 4e for rise and fall each connects a predetermined position of each horizontal member 4d and an elevation mechanism (not illustrated). The second supporting member 5 includes engagement members 5a at every predetermined distance at positions which are adjacent to left and right side edges of the stream arrangement plate member 6. Each engagement member 5a engages a peripheral section of the substrate 3. Plate members 6a elongating upward are provided at four corner sections of the stream arrangement plate member 6. The upper edge sections of the front side pair of the plate members 6a are connected by a horizontal member 6b extending outward and having a gate shape. The upper edge sections of the rear side pair of the plate members 6a are connected by a horizontal member 6b extending outward and having a gate shape. A predetermined position of each horizontal member 6b and an elevation mechanism (not illustrated) are connected to one another by a stay 6c for rise and fall.

Operations and effects of the device for processing a substrate having the above arrangement are as follows.

The substrate 3 is brought into the processing vessel 1 using the first supporting member 4. Cleaning fluid outgone from the cleaning fluid supplying pipe Id is supplied upward with a predetermined velocity distribution through the stream arrangement plate member 6 under this condition. Therefore, the substrate 3 is cleaned. Further, cleaning fluid overflowed from the processing vessel 1 is discharged through the overflow vessel 1b and the cleaning fluid discharging pipe 1c.

When the substrate 3 supported by the first supporting member 4 is cleaned, portions of the substrate 3 which are engaged with the first supporting member 4. But, the above portions are cleaned by rising the second supporting member 5 by a little distance so as to engage peripheral portions of the substrate 3 and by falling the first supporting member 4 further so as to be apart from the substrate 3. Therefore, the entire surface of the substrate 3 is uniformly cleaned.

After the cleaning of the substrate 3 has finished by the above operations, the outer vessel 2 is sealed by providing the cover body. Then, the substrate 3 is dried by discharging the cleaning fluid through the cleaning fluid discharging pipes 1a and 1c and by supplying the drying fluid (for example, isopropyl alcohol vapor or mist or the like) into the outer vessel 2 from the drying fluid supplying member 2b. The discharging operation and the supplying operation are carried out simultaneously. This drying operation is realized by replacing the remaining cleaning fluid with the drying fluid so as to form drying fluid membrane, the remaining cleaning fluid remains at a portion which is upper with respect to the surface of the cleaning fluid. This drying operation is so called as Marangoni drying operation.

At the initial stage of this drying processing, the substrate 3 is supported by the first supporting member 4 and the second supporting member 5 is apart from the substrate 3. Therefore, portions of the substrate 3 which are to be engaged with the second supporting member 5 are rapidly dried after the portions has positioned above the surface of the cleaning fluid.

When the surface of the cleaning fluid is lowered to a position which is between the first supporting member 4 and the second supporting member 5, the second supporting member 5 is moved upward so as to engage peripheral sections of the substrate 3, then the first supporting member 4 is moved downward so as to be apart from the substrate 3, so that the substrate 3 is transferred from the first supporting member 4 to the second supporting member 5. Therefore, the relative position of the substrate 3 with respect to the processing vessel 1 is maintained to be a constant position and the relative speed of the substrate 3 with respect to the surface of the cleaning fluid is maintained to be a constant speed, so that the uniformly drying is continued. In other words, varying in drying, stains and the like are prevented from occurrence.

After the transferring of the substrate 3 has carried out by the above operation, drying of the substrate 3 is carried out so that portions of the substrate 3 are rapidly dried which portions being engaged with the first supporting member 4.

After discharging operation of the cleaning fluid has finished, nitrogen gas is supplied from the drying fluid supplying member 2b so as to discharge the cleaning fluid. Then, the cover body of the outer vessel 2 is removed and the dried substrate 3 is brought out from the processing vessel 1 by the first supporting member 4.

In this embodiment, the stream arrangement plate member 6 is taken out from the processing vessel 1 without providing a special mechanism because the second supporting member 5 and the stream arrangement plate member 6 are united to one another. Further, the width of the processing vessel 1 can be determined to be equal to the width of the stream arrangement plate member 6 so that the processing vessel 1 is prevented from enlarging over the necessary size and that the necessary quantity of the cleaning fluid is reduced.

The device for processing a substrate according to the present invention is not limited to the above embodiments. For example, the first supporting member 4 and the second supporting member 5 made of material having waiter repellency may be employed. A pair of the first supporting members 4 may be united to one another. Various modifications and changing within the scope of the present invention are applicable to the device for processing a substrate.

INDUSTRIAL UTILIZATION

When a substrate is processed by supplying processing fluid within a processing vessel in which the substrate is housed therein, the entire surface of the substrate is uniformly processed by processing the portions of the substrate which portions are supported by a supporting member.

What is claimed is:

1. A device for processing a substrate is a device which houses a substrate (3) within a processing vessel (1) and processes the substrate (3) by supplying processing fluid within the processing vessel (1), the device comprising:

a first supporting member (4) for supporting a substrate (3) stably and for carrying out bringing of the substrate (3) into and out from the processing vessel (1);

a movable second supporting member (5) for receiving the substrate (3) from the first supporting member (4) and for supporting the substrate (3) stably within the processing vessel (1); and wherein the first supporting member (4) and the movable second supporting member (5) are operated when the substrate (3) is transferred from one member to the other member, so that relative movement of the substrate (3) with respect to the processing vessel (1) is prevented from occurrence.

2. A device for processing a substrate as set forth in claim 1, wherein a supporting member which is united with a stream arrangement plate member (6) is employed as the second supporting member (5), the stream arrangement plate member (6) supplying processing fluid having predetermined velocity distribution within a substrate housing section of the processing vessel from the bottom section of the processing vessel.

3. A device for processing a substrate is a device which houses a substrate (3) within a processing vessel (1) and processes the substrate (3) by supplying processing fluid within the processing vessel (1), the device comprising:

a first supporting member (4) configured to support a substrate (3) stably and to bring the substrate (3) into and out from the processing vessel (1);

a movable second supporting member (5) configured to receive the substrate (3) from the first supporting member (4) and to support the substrate (3) stably within the processing vessel (1); and wherein the first supporting member (4) and the movable second supporting member (5) are operated when the substrate (3) is transferred from one member to the other member, so that relative movement of the substrate (3) with respect to the processing vessel (1) is prevented from occurrence.

4. A device for processing a substrate as set forth in claim 3, wherein a supporting member which is united with a stream arrangement plate member (6) is employed as the second supporting member (5), the stream arrangement plate member (6) being configured to supply processing fluid having predetermined velocity distribution within a substrate housing section of the processing vessel from the bottom section of the processing vessel.

5. A device for processing a substrate is a device which houses a substrate (3) within a processing vessel (1) and processes the substrate (3) by supplying processing fluid within the processing vessel (1), the device comprising:

a first supporting member (4) having means for supporting a substrate (3) stably and means for carrying out bringing of the substrate (3) into and out from the processing vessel (1); and a movable second supporting member (5) having means for receiving the substrate (3) from the first supporting member (4) and means for supporting the substrate (3) stably; and further including means for operating the first supporting member (4) and the second supporting member (5) when the substrate (3) is transferred so that relative movement of the substrate (3) with respect to the processing vessel (1) is prevented from occurrence.

6. A device for processing a substrate as set forth in claim 5, wherein a supporting member which is united with a stream arrangement plate member (6) is employed as the second supporting member (5), the stream arrangement plate member (6) including means for supplying processing fluid having predetermined velocity distribution within a substrate housing section of the processing vessel from the bottom section of the processing vessel.

7. A device for processing a substrate as set forth in claim 1, wherein the substrate is transferred from the first supporting member to the second supporting member at a time that fluid contacts the substrate and the substrate is entirely inside the vessel.

8. A device for processing a substrate as set forth in claim 7, wherein the substrate is transferred from the first supporting member to the second supporting member at a time that a level of said fluid is in between the first supporting member and the second supporting member.

9. A device for processing a substrate as set forth in claim 8, wherein prior to transfer from the first supporting member to the second supporting member, the second supporting member is spaced away from said substrate, and wherein subsequent to said transfer, said first supporting member is spaced away from said substrate.

* * * * *